United States Patent
Li

(10) Patent No.: US 8,441,324 B2
(45) Date of Patent: May 14, 2013

(54) VOLTAGE-CONTROLLED OSCILLATOR AND RADAR SYSTEM

(75) Inventor: Hao Li, Munich (DE)

(73) Assignee: Freescale Semiconductor, Inc., Austin, TX (US)

( * ) Notice: Subject to any disclaimer, the term of this patent is extended or adjusted under 35 U.S.C. 154(b) by 241 days.

(21) Appl. No.: 12/937,860

(22) PCT Filed: May 13, 2008

(86) PCT No.: PCT/IB2008/051882
§ 371 (c)(1),
(2), (4) Date: Oct. 14, 2010

(87) PCT Pub. No.: WO2009/138817
PCT Pub. Date: Nov. 19, 2009

(65) Prior Publication Data
US 2011/0043401 A1 Feb. 24, 2011

(51) Int. Cl.
*H03B 5/12* (2006.01)
(52) U.S. Cl.
USPC .................................. 331/117 R; 331/117 D
(58) Field of Classification Search .................. None
See application file for complete search history.

(56) References Cited

U.S. PATENT DOCUMENTS

| | | | | |
|---|---|---|---|---|
| 5,019,791 A | * | 5/1991 | Cohen | 331/96 |
| 5,159,293 A | | 10/1992 | Pulice | |
| 6,812,754 B1 | * | 11/2004 | Nakanishi | 327/157 |
| 7,053,722 B2 | | 5/2006 | Rein et al. | |
| 2005/0084053 A1 | | 4/2005 | Rohde et al. | |
| 2006/0033586 A1 | * | 2/2006 | Rohde et al. | |
| 2008/0132195 A1 | * | 6/2008 | Maxim et al. | 455/334 |
| 2008/0211592 A1 | * | 9/2008 | Gaussen | 331/154 |
| 2008/0297266 A1 | * | 12/2008 | Kahmen | 331/117 D |
| 2009/0256740 A1 | * | 10/2009 | Teshirogi et al. | 342/204 |

FOREIGN PATENT DOCUMENTS

| | | |
|---|---|---|
| DE | 102006009467 A1 | 9/2007 |
| GB | 2274562 A | 7/1994 |

OTHER PUBLICATIONS

Li Hao et al: "Fully Integrated SiGe VCOs with Powerful Output Buffer for 77-GHz Automotive Radar Systems and Applications Around 100 GHz", IEEE Journal of Solid-State Circuits, vol. 39, No. 10, Oct. 2004, pp. 1650-1658.
Li Hao et al: "Millimeter-Wave VCOs with Wide Tuning Range and Low Phase Noise, Fully Integrated in a SiGe Bipolar Production Technology", IEEE Journal of Solid-State Circuits, vol. 38, No. 2, Feb. 2003, pp. 184-191.
International Search Report and Written Opinion correlating to PCT/IB2008/051882 dated Aug. 29, 2008.

* cited by examiner

*Primary Examiner* — Timothy A Brainard

(57) ABSTRACT

A voltage-controlled oscillator circuit comprises an output terminal for providing an oscillatory output signal thereat, a first inductor, a varactor, and a negative-resistance element. The varactor's capacitance is a function of a tuning potential applied at a first terminal of the varactor. A bias branch is present for coupling a second terminal of the varactor to a bias potential. The bias branch comprises a second inductor or a transmission line. The bias branch may comprise a transmission line the length of which is one quarter wavelength associated with the resonance frequency of the voltage-controlled oscillator circuit. A radar system including a VCO circuit is further disclosed.

20 Claims, 5 Drawing Sheets

US 8,441,324 B2

VOLTAGE-CONTROLLED OSCILLATOR AND RADAR SYSTEM

FIELD OF THE INVENTION

This invention relates to a voltage-controlled oscillator circuit and to a radar system.

BACKGROUND OF THE INVENTION

Voltage-controlled oscillators (VCOs) are typically used in applications that require the generation of high frequency signals, e.g. in communication or sensor systems such as radar. One of the aspects by which the quality of a VCO is judged is the phase noise of the generated oscillation signal, as the phase noise can significantly limit the performance of a VCO-based system. Indeed a low phase noise is usually a chief requirement for any VCO.

FIG. 1 schematically shows an example of a simple generic VCO circuit 10 of the Colpitts type. A detailed discussion of this specific form of VCO has been given by Hao Li and Hans-Martin Rein, "Millimeter-Wave VCOs With Wide Tuning Range And Low Phase Noise, Fully Integrated in a SiGe Bipolar Production Technology", IEEE Journal of Solid State Circuits, Vol. 38, p. 184 (2003) [Ref. 1]. Therefore only the basic features thereof will be summarized, for the sake of completeness. The oscillator circuit 10 comprises an inductor 32 (referred to here as the first inductor), a varactor 18, and a negative resistance element 30 in the form of an NPN bipolar transistor. The first inductor 32 couples a virtual ground 34 to the base of the bipolar transistor 30. The transistor's 30 emitter is coupled to the varactor 18, which is reverse-biased by means of a potential applied at a tuning terminal 22. A node 16 between the transistor's 30 emitter is coupled to the ground 12 via a current source 14. The transistor's 30 collector is coupled via a matching circuit 26 to an output terminal 24 at which a load (not shown) may be coupled. A supply terminal 28 for applying a voltage with respect to the ground 12 is coupled to the collector of the transistor 30 via the matching circuit 26. The inductor's 32 inductance L and the capacitor's 36 capacitance C together essentially determine the resonance frequency of the circuit. By varying the potential at the terminal 22, the varactor's capacitance C and hence the frequency of the circuit can be varied. The varactor can be any variable capacitance diode known in the art. The whole circuit 10 may be symmetric under a reflection by a symmetry axis 20 to provide a differential output between the first output terminal 24 and a corresponding output terminal 24' (not shown). Finally it is noted that the instantaneous electric potential at a selected point within the circuit 10, that is, the voltage between the selected point and ground potential 12, is generally oscillatory but not zero on average. In the following a potential averaged over one oscillation period shall be referred to as a "direct current (DC) potential".

A drawback of the circuit 10 is that in order to reverse-bias the varactor 18, the tunable potential $V_{TUNE}$ applied at the varactor 18 by means of the terminal 22 needs to be larger than $V_E$, the potential at the emitter of the transistor 30. In order to provide the desired large tuning range for the tuning potential, the maximal tuning potential thus needs to be larger than the supply voltage $V_C$ applied at the supply terminal 28, typically 5 V or 3.3 V. Therefore, providing a sufficiently large tuning voltage requires additional efforts, such as providing an additional supply voltage, which increases the costs for practical applications.

Attempts have already been made to overcome the need for an additional supply voltage in a VCO. Referring now to FIG. 2, there is shown a VCO circuit of the type discussed above, however incorporating additionally a bias branch 36, 38 shortened to the ground 12. The branch's other terminal 36 is coupled to the varactor's terminal that is not coupled to the terminal 22 at which the tuning potential $V_{TUNE}$ is applied. The AC-coupling capacitor 40 and DC-bias resistor $R_{BIAS}$ 38 allow for a voltage between the nodes 16 and 36, so that the DC potential at the node 36 may be lower than $V_E$, the DC potential at the emitter of the transistor 30. The current flowing in the resistor 38 being very small, the tuning potential may be set from 0 to its maximal value $V_{TUNE,MAX}$, which now coincides essentially with the supply voltage $V_C$. Contrary to the circuit of FIG. 1, an additional voltage source is not needed.

However, this circuit has a number of shortcomings. Firstly, the resistor 38 introduces new noise to the oscillator core. For achieving a low phase noise the resistor's 38 resistance $R_{BIAS}$ needs to be optimized. If $R_{BIAS}$ is too small, the varactor's quality factor is degraded, resulting in a worse phase noise. On the other hand, if $R_{BIAS}$ is too large the noise contribution from the resistor itself is large. An optimized resistor 38 value $R_{BIAS}$ can be found by making a compromise between the quality factor of the varactor and the noise contribution of the resistor. Indeed computations and measurements show that the single-side band (SSB) phase noise is minimum for a unique positive value of $R_{BIAS}$. Nevertheless, even when the resistance $R_{BIAS}$ is optimized, the phase noise of the VCO is worse compared to the circuit of the type shown in FIG. 1, which does not have a bias branch.

SUMMARY OF THE INVENTION

The present invention provides a voltage-controlled oscillator circuit and a radar system as described in the accompanying claim.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. Identical reference numerals are used to indicate similar or analogous components.

DETAILED DESCRIPTION OF THE PREFERRED EMBODIMENTS

Figure 1:
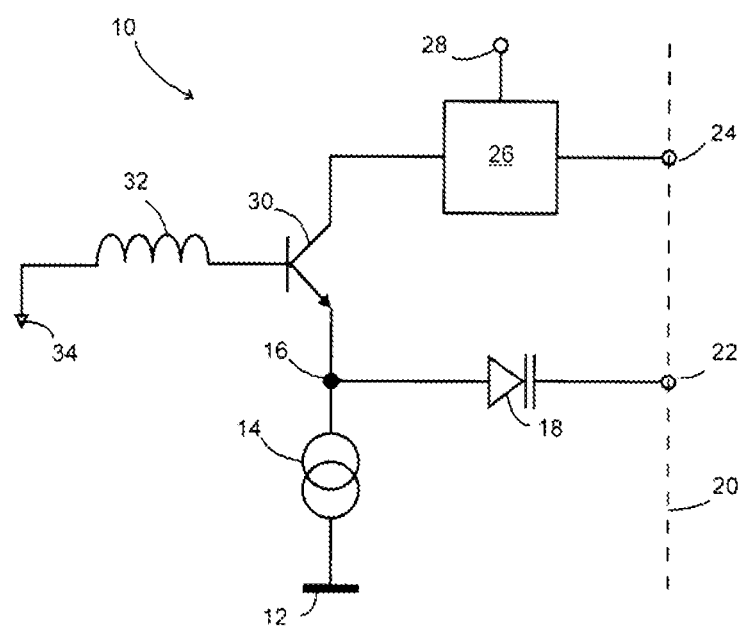
FIG. 1 schematically shows an example of a simple voltage-controlled oscillator (VCO) according to the prior art.
Figure 2:
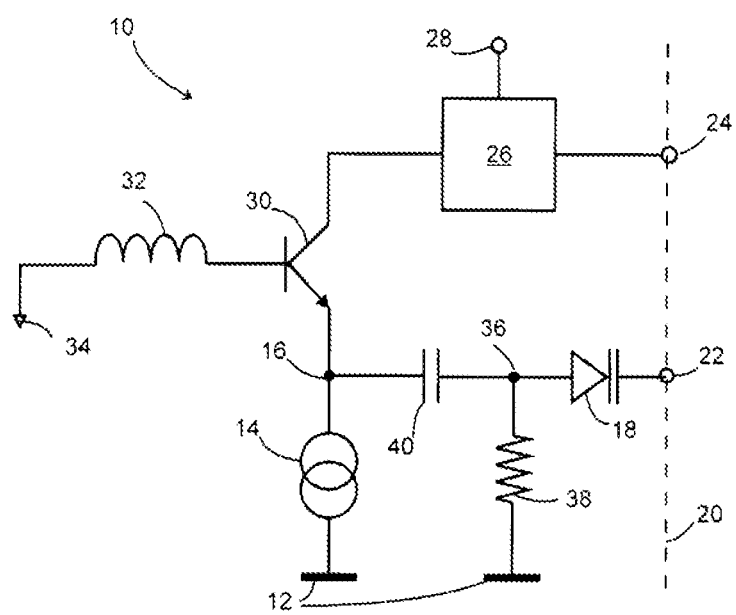
FIG. 2 schematically shows the VCO of FIG. 1 incorporating a prior-art bias branch for biasing a varactor of a resonator core of the VCO.
Figure 3:
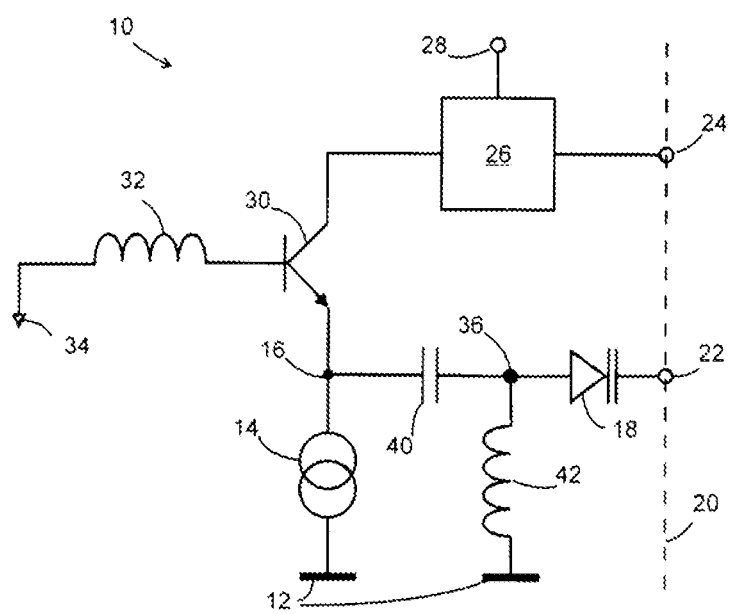
FIG. 3 schematically shows an example of an embodiment of a VCO according to the invention.

FIG. 3 schematically illustrates a voltage-controlled oscillator circuit 10 according to the invention. The VCO circuit 10 comprises an output terminal 24 for providing an oscillatory output signal thereat, a first inductor 32, a varactor 18, and a negative-resistance element 30, wherein the varactor's capacitance is a function of a tuning potential 22 applied at a first terminal of the varactor, and a bias branch 36, 42 for coupling a second terminal of the varactor to a bias potential 12. For the sake of brevity, these components also shown and described in the context of FIG. 2 will not be described in fuller details.

In the example of FIG. 3, the bias branch comprises a second inductor or a transmission line 42. A voltage within the circuit 10 is a superposition of voltage signals having different frequencies (Fourier components). An inductor or a transmission line behave differently for different Fourier components. For the DC operating point, the inductor or transmission line 42 shorts the node 36 to the ground 12. Thus the DC potential at the node 36 is the ground potential. Therefore the supply potential provided at supply terminal 28 is sufficient for applying the desired reverse-biasing voltage across the varactor 18, by coupling the tuning terminal to the supply terminal 28, for example, using a voltage divider. The difference between the DC potential at nodes 16 and 36 manifests itself as a DC voltage across the AC-coupling capacitor 40. In contrast, at high frequencies and in particular at the resonance frequency (typically in the MHz or GHz range), the capacitor's 40 impedance is negligible whereas the impedance of the inductor or transmission line's is practically infinite. Thus neither the capacitor 40 nor the bias branch 36, 42 affect the high-frequency behaviour of the resonator core 32, 30, 16, 18. Furthermore, due to the absence of a resistive element in the bias branch 36, 42, the phase noise can be expected to be significantly reduced as compared to the circuit of FIG. 2. Simulations predict that the phase noise can be improved by about 2 to 3 dBc/Hz. It will be apparent that in practice, the improvement may be more or less. For transmission lines with a real or virtual short at its ends, the input impedance of the transmission line becomes infinite if the length of the line coincides with one quarter wavelength of the signal propagating through the line (see e.g. Ref. [1]). Therefore the inductor or transmission line 42 is preferably a transmission line 42 the length of which is substantially one quarter wavelength associated with the resonance frequency of the voltage-controlled oscillator circuit. For many applications the length of the transmission line 42 is thus in the millimeter or micrometer range.

Figure 4:
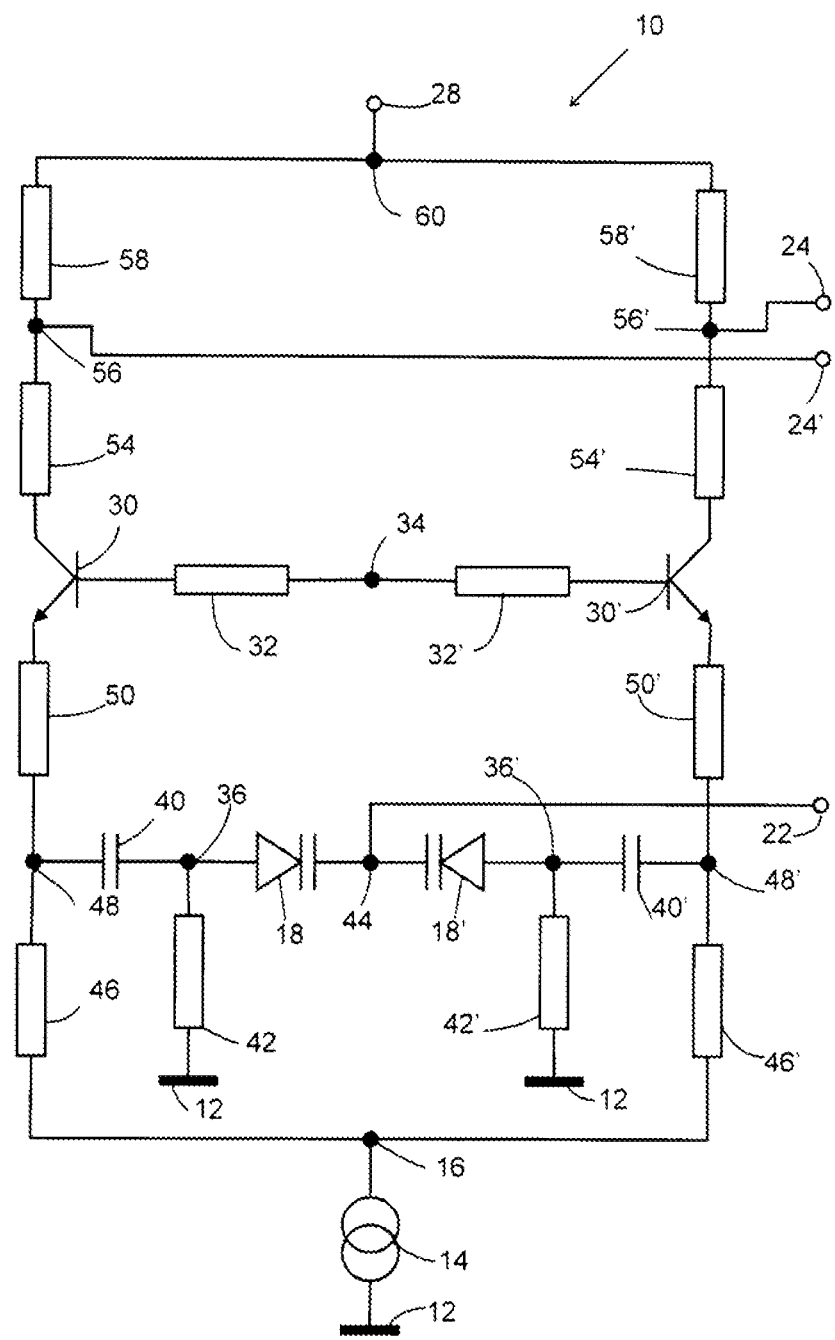
FIG. 4 schematically shows a more complex VCO, incorporating two identical bias branches according to the invention, as well as additional components known in the art.

Referring now to FIG. 4, an example of a VCO circuit is shown. A detailed description of the basic outline of the circuit can be found in U.S. Pat. No. 7,053,722 B2 and will not be fully repeated here. The voltage-controlled oscillator circuit 10 comprises an output terminal 24 for providing an oscillatory output signal thereat, a first inductor 32, a varactor 18, and a negative-resistance element 30. The varactor's capacitance is a function of a tuning potential 22 applied at a first terminal of the varactor. The negative resistance element 30 is coupled between the first inductor 32 and the varactor 18. However, the negative resistance element, which may compensate for energy losses in the oscillator, may be provided in parallel to the inductor or to the capacitor of the LC-resonance circuit.

In the example of FIG. 4, the negative-resistance element comprises a transistor 30. More particularly, in this example the negative-resistance element is an NPN bipolar transistor 30 having a base, a collector, and an emitter, the base being coupled to the first inductor 32, the emitter being coupled to the varactor 18, and the collector being coupled to an output terminal 24. The oscillator is thus of the Colpitts-type. The VCO circuit further comprises a bias branch 36, 42 for coupling a second terminal of the varactor to a bias potential 12.

The example shown in FIG. 4 comprises two subcircuits. In this example, the subcircuits are arranged symmetrically to each other with respect to virtual ground points 44, 34, 60, 16. The subcircuits are substantially similar. The first subcircuit comprises the first inductor 32, the varactor 18, the negative-resistance element 30, and the bias branch 36, 42. The latter elements may be similar to those described with reference to FIG. 3 and for the sake of brevity will not be described in further detail. Such a symmetric configuration has proven particularly convenient for providing a differential output voltage. Additional inductors 50 and 46 with respective inductivities $L_{E1}$ and $L_{E2}$ are serially coupled between the emitter of the transistor 30 and the current source 14. The AC-coupling capacitor 40 is coupled to the emitter of the transistor 30 via a node 48 between the additional inductors 50 and 46. The circuit further comprises an inductive voltage divider 54, 58 comprising two serially coupled inductors 58 and 54 with respective inductivities $L_{C1}$ and $L_{C2}$. The inductive voltage divider 54, 58 couples the collector of the bipolar NPN transistor 30 to the virtual ground node 60 and thus to the supply terminal 28. The oscillator circuit 10 generates a differential output voltage at nodes 56 and 56' situated respectively between the voltage divider inductors 54 and 58, and 54' and 58'. The nodes 56 and 56' connect to output terminals 24 and 24', respectively.

The oscillator further comprises a first supply terminal 12 and a second supply terminal 28 for receiving a supply voltage, for example from an external device connected to a chip on which the circuit 10 is implemented.

Similar to the example of FIG. 3, there is provided a bias branch 36, 42 which couples the node 36 situated between the AC-coupling capacitor 40 and the varactor 18 to the ground 12. The bias branch 36, 42 comprises a second inductor or a transmission line 42. The transmission line 42 can, for example, be a λ/4 transmission line of the type described in U.S. Pat. No. 7,053,722 B2.

The circuit 10 further comprises an AC-coupling capacitor 40 coupled between the negative-resistance element 30 and the varactor's 18 second terminal. Thereby the potential at the varactor's 18 second terminal can be decoupled from the potential at the negative-resistance element 30.

The bias branch couples a node 36 situated between the capacitor 40 and the varactor's 18 second terminal to the bias potential 12. Thereby the DC potential at the varactor's 18 second terminal 12 is set equal to the bias potential 12. The impedance of the bias branch 36, 42 at the resonance frequency of the voltage-controlled oscillator circuit may be sufficiently large for the current flowing in the bias branch to be negligible compared to the current flowing between the first inductor 32 and the varactor 18.

The bias branch 36, 42 may for example comprise a transmission line 42 the length of which is one quarter wavelength associated with the resonance frequency of the voltage-controlled oscillator circuit. Thereby the bias branch's impedance at the oscillation frequency can be very high.

The bias branch 36, 42 may be shortened to either the first 12 or the second supply terminal 28, only the first alternative being shown in the example. In both cases, this enables the whole range between the potentials at the first 12 and the second 26 supply terminal to be available for the tuning potential. It is noted that the voltage between the tuning terminal 22 and the ground 12 may well be reversed, under the condition that the orientation of the varactor diode 18 is also reversed. In other words, the terminal 22 could be shortened to ground, while the bias branch is set to the tuning potential instead of the ground potential.

The tuning potential at the terminal 22 may be provided by a voltage divider (not shown) coupled between the first supply terminal 12 and the second supply terminal 28. For example, the voltage divider may be a simple potentiometer. It is noted that the tuning potential 22 may be constant, for producing a sinusoidal signal, or varying, for producing a modulated signal.

Figure 5:
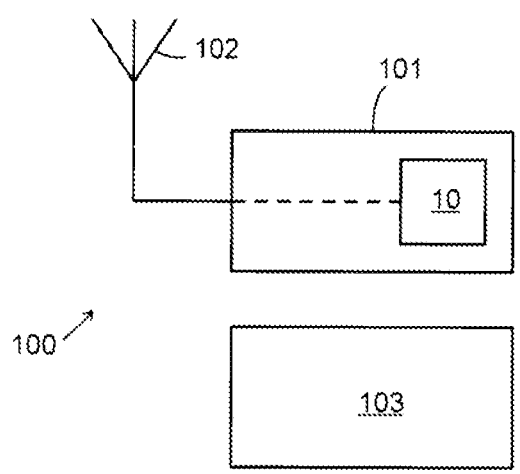
FIG. 5 schematically shows an example of a radar system according to the invention.

The voltage-controlled oscillator circuit 10 may, for example, be used in a radar system for generating the fundamental oscillatory signal to be amplified and coupled to an antenna. Referring to FIG. 5, the example of a radar system 100 shown therein includes a signal generator 101 connected to an antenna 102. As shown, the signal generator 101 includes a VCO 10 which is used to generate a base signal used by the signal generator 101 to generate a signal of suitable frequency and amplitude with a desired type of modulation. The frequency may for example be above 100 MHz, such as more than 1 GHz, for example (several) tens of GHz, 77 GHz for example.

As shown, the radar system 100 includes a detector 103. The detector 103 can detect the electromagnetic signals emitted via the antenna 102 that are reflected by objects and use the detected electromagnetic signals to generate information about the objects.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may be direct connections or indirect connections. Also, for example, the VCO 10 may be provided as a single integrated circuit or as a circuit comprising two or more separate components connected to form the VCO.

Furthermore, the VCO may be implemented as a design suitable to manufacture a semiconductor product, e.g. as a set of masks.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A voltage-controlled oscillator circuit comprising:
an output terminal for providing an oscillatory output signal thereat
an inductor, a varactor, and a negative-resistance element, wherein a resonance frequency of the voltage-controlled oscillator circuit is determined by the inductor and a capacitance of the varactor, and the capacitance being a function of a tuning potential applied at a first terminal of the varactor; and
a bias branch for coupling a second terminal of the varactor to a bias potential, the bias branch comprising a transmission line the length of which is one quarter wavelength associated with the resonance frequency of the voltage-controlled oscillator circuit, wherein the bias branch does not affect the resonance frequency.

2. The voltage-controlled oscillator circuit as claimed in claim 1, wherein the negative resistance element is coupled between the inductor and the varactor.

3. The voltage-controlled oscillator circuit as claimed in claim 1, wherein the negative-resistance element comprises a transistor.

4. The voltage-controlled oscillator circuit as claimed in claim 1, wherein the negative-resistance element is an NPN bipolar transistor having a base, a collector, and an emitter, the base being coupled to the inductor, the emitter being coupled to the varactor, and the collector being coupled to an output terminal.

5. The voltage-controlled oscillator circuit as claimed in claim 1, further comprising an AC-coupling capacitor coupled between the negative-resistance element and the varactor's second terminal.

6. The voltage-controlled oscillator circuit as claimed in claim 5, wherein the bias branch couples a node situated between the capacitor and the varactor's second terminal to the bias potential.

7. The voltage-controlled oscillator circuit as claimed in claim 1, wherein the impedance of the bias branch at the resonance frequency of the voltage-controlled oscillator circuit is sufficiently large for the current flowing in the bias branch to be negligible compared to the current flowing between the inductor and the varactor.

8. The voltage-controlled oscillator circuit as claimed in claim 1, wherein the resonance frequency is above 1 GHz.

9. The voltage-controlled oscillator circuit as claimed in claim 1, further comprising a first supply terminal and a second supply terminal for receiving a supply voltage.

10. The voltage-controlled oscillator circuit as claimed in claim 1, wherein the bias branch is shortened to either the first or the second supply terminal.

11. The voltage-controlled oscillator circuit as claimed in claim 1, wherein the tuning potential is provided by a voltage divider coupled between the first supply terminal and the second supply terminal.

12. The voltage-controlled oscillator circuit as claimed in claim 1, comprising two identical subcircuits arranged symmetrically to each other with respect to virtual ground points, the first subcircuit comprising the inductor, the varactor, the negative-resistance element, and the bias branch.

13. The voltage-controlled oscillator circuit as claimed in claim 12, wherein each of the two identical subcircuits comprises an output terminal, the output terminals being coupled to an output buffer, an amplifier, or an antenna.

14. A voltage-controlled oscillator circuit comprising:
an output terminal for providing an oscillatory output signal thereat
a first inductor, a varactor, and a negative-resistance element, wherein the varactor's capacitance is a function of a tuning potential applied at a first terminal of the varactor; and
a bias branch for coupling a second terminal of the varactor to a bias potential, the bias branch comprising a transmission line the length of which is one quarter wavelength associated with the resonance frequency of the voltage-controlled oscillator circuit;
wherein:
the inductor includes a first terminal that is coupled to a virtual ground;
the negative-resistance device includes a first terminal that is coupled to a second terminal of the inductor, a second terminal that is coupled to the output terminal, and a third terminal that is coupled to the second terminal of the varactor.

15. A method comprising:
providing a resonance frequency output of a voltage-controlled oscillator circuit, wherein the resonance frequency is determined by an inductor and a capacitance of a varactor, and the capacitance is a function of a tuning potential applied at a first terminal of the varactor; and
providing a bias branch for coupling a second terminal of the varactor to a bias potential, the bias branch comprising a transmission line the length of which is one quarter wavelength associated with the resonance frequency of the voltage-controlled oscillator circuit, wherein resonance frequency of the voltage-controlled oscillator circuit is not affected by the bias branch.

16. The method as claimed in claim 15, further comprising coupling the negative-resistance element between the inductor and the varactor.

17. The method as claimed in claim 15, wherein the negative-resistance element comprises a transistor.

18. The method as claimed in claim 15, wherein the negative-resistance element is an NPN bipolar transistor having a base, a collector, and an emitter, the base being coupled to the inductor, the emitter being coupled to the varactor, and the collector being coupled to an output terminal.

19. The method as claimed in claim 15, further comprising coupling an AC-coupling capacitor between the negative-resistance element and the varactor's second terminal.

20. The method as claimed in claim 15, wherein the impedance of the bias branch at the resonance frequency of the voltage-controlled oscillator circuit is sufficiently large for the current flowing in the bias branch to be negligible compared to the current flowing between the inductor and the varactor.

* * * * *